June 24, 1969 W. B. SCOTT, JR., ET AL 3,451,733

APPARATUS FOR MOUNTING ROTATABLE SHAFT

Filed Sept. 1, 1966

INVENTORS:
WILLIAM B. SCOTT, JR.
GLENN R. MUNDSCHENK,

BY William S. Wolfe
THEIR ATTORNEY 3,451,733

APPARATUS FOR MOUNTING ROTATABLE SHAFT

William B. Scott, Jr., New Hartford, and Glenn R. Mundschenk, Utica, N.Y., assignors to General Electric Company, a corporation of New York Filed Sept. 1, 1966, Ser. No. 576,638
Int. Cl. F16c *35/00, 13/00, 27/00*
U.S. Cl. 308—15 4 Claims

ABSTRACT OF THE DISCLOSURE

Apparatus for rotatably mounting a shaft having a flange positioned thereon to a cabinet. One surface of the flange engages the inner surface of the radio cabinet while the opposite surface is slideably engaged by a deflectable key member to rotatably lock the shaft to the cabinet.

The present invention is directed toward apparatus for mounting a rotatable shaft to a radio receiver cabinet.

It is necessary in radio receivers to mount at least one rotatable shaft. For example, in a conventional arrangement a tuning shaft extends through an aperture in the radio receiver cabinet, a tuning knob being provided at the outer end thereof and a windlass being provided at the inner end thereof. A dial cord is strung around the windlass in such a manner that rotation of the tuning knob results in tuning of the radio receiver while at the same time positioning a dial pointer to indicate the frequency of the station selected.

In the past, the mounting of such a rotatable shaft has necessitated the use of relatively complicated and expensive techniques. More specifically, the prior art has required the use of discrete fastening devices such as spring clips attached to the shaft for mounting the shaft to the radio receiver cabinet.

The present invention completely overcomes the necessity for the use of discrete fastening devices.

Accordingly, it is an object of the invention to provide an improved apparatus for rotatably mounting a tuning shaft in a radio receiver.

A further object is to provide an apparatus for rotatably mounting a tuning shaft which is less complex and expensive than prior art devices.

Yet another object is to provide an apparatus for rotatably mounting a tuning shaft which completely eliminates the necessity for discrete fastening devices as employed in the prior art.

These and other objects are achieved in one embodiment of the invention through the use of a tuning shaft having a flange positioned thereon, one surface of the flange engaging the inner surface of the radio cabinet when the shaft is inserted in a suitable aperture in the cabinet, while the opposite surface is engaged by a tapered key member to rotatably lock the shaft to the cabinet. The U-shaped member includes spaced leg portions extending inwardly from the cabinet and a transverse deflectable portion extending therebetween. The key member is positioned on the transverse deflectable portion intermediate the two leg portions in such a manner that the key is initially deflected when the shaft is inserted in the aperture. However, when the shaft is completely inserted in the aperture so that the flange abuts the inner surface of the cabinet, the transverse portion returns to the undeflected position, the key thereby engaging the flange to lock the shaft in the cabinet while still permitting rotation thereof.

Figure 1:
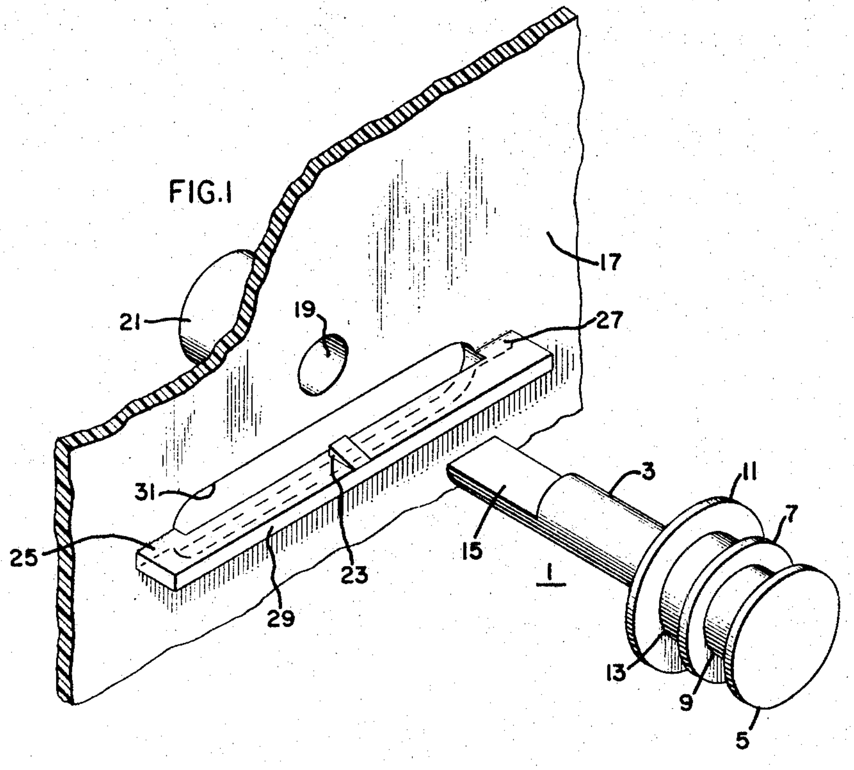
Figure 2:
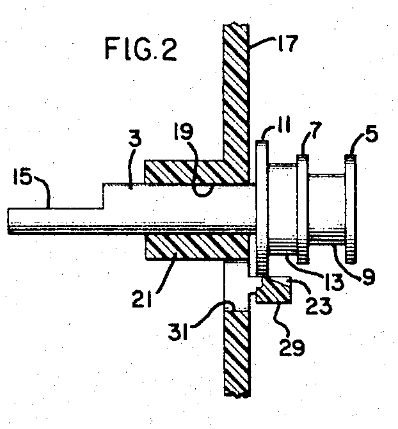
Figure 4:
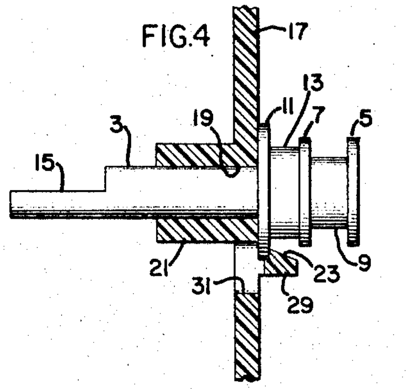
Figure 3:
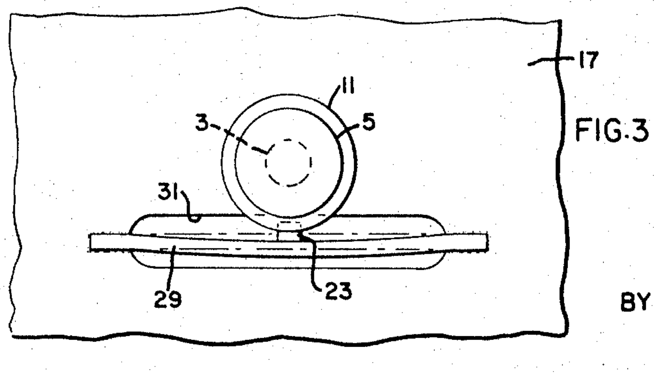

The novel and distinctive features of the invention are set forth in the appended claims. The invention itself, together with further objects and advantages thereof, may best be understood by reference to the following description and accompanying drawings, in which:

FIGURE 1 is an exploded perspective view of an apparatus in accordance with the invention, FIGURE 2 is a cross sectional view of the apparatus depicted in FIGURE 1 showing the tuning shaft in a partially assembled position, FIGURE 3 is an end view with the tuning shaft positioned as shown in FIGURE 2, and FIGURE 4 is a cross sectional view similar to FIGURE 2, but showing the shaft in the completely assembled position.

Referring to FIGURE 1, there is shown generally at 1 a tuning shaft assembly including a rotatable shaft 3. First and second spaced flanges 5 and 7 respectively are provided at a first end of the shaft, an increased diameter portion 9 of the shaft extending between the first and second flanges. The flanges 5 and 7 in conjunction with the increased diameter portion 9 provide a windlass about which a dial cord may be wound in conventional fashion.

In accordance with the invention, a third flange 11 is provided intermediate the second flange 7 and the second end of the shaft 3, an increased diameter portion 13 of the shaft is provided intermediate the third flange 11 and the second flange 7. The second end of the shaft 3 is provided with a flatted portion 15 to allow a tuning knob (not shown) to be lockedly positioned on the shaft in conventional fashion.

In accordance with the invention, the shaft assembly 1 is assembled to a radio receiver cabinet shown generally at 17 in simplified and inexpensive fashion while eliminating the necessity for discrete fastening devices.

As depicted, the cabinet 17 is provided with an aperture 19 and an outwardly extending well portion 21, the aperture being adapted to receive the shaft 3 and the well portion 21 providing a bearing surface for the shaft.

A tapered key member 23 is provided to lockedly engage the rear surface of the flange member 11 to rotatably mount the shaft assembly 1 to the cabinet 17. The tapered key member 23 is positioned on a generally U-shaped member comprising first and second leg portions 25 and 27 respectively formed integrally with and extending inwardly from the cabinet 17. The U-shaped member further comprises a transverse deflectable portion 29 formed integrally with and extending between the leg portions 25 and 27. As depicted, the key portion 23 is positioned on the transverse portion 29 intermediate the leg portions 25 and 27 in such a manner that the key portion 23 may be deflected in a vertical plane. In order to simplify molding techniques, an elongated aperture 31 may be provided underlying the transverse portion 29 as shown.

Referring now to FIGURES 2 and 3, the manner in which the shaft assembly 1 is assembled to the cabinet 17 is shown. As depicted, in FIGURES 2 and 3, the shaft 3 is inserted in the aperture 19 and the flange 11 is advanced towards the rear of the cabinet 17. Since the distance from the axis of the shaft to the undeflected key portion 23 is less than the radius of the flange 11, the transverse deflectable portion 29 is deflected as shown most clearly in FIGURE 3, the dotted line indicating the undeflected position of the transverse member 29.

As shown in FIGURE 4, the width of the flange is slightly less than the distance from the rear of the cabinet to the key member 23. Accordingly, the transverse member 25 returns to the undeflected position when the flange 11 abuts the inner surface of the cabinet 17. In the position, the key member 23 lockedly engages the flange 11 to prevent axial motion of the shaft assembly 1 while permitting rotation thereof in the desired fashion.

In a preferred embodiment of the invention, the cabinet 17, including the U-shaped member, is injection molded in a single operation from a styrene material. Similarly, the shaft assembly 1 is injection molded in a single operation from a Delrin (acetal resin) material.

Although the invention has been described with respect to certain specific embodiments, it will be appreciated that modifications and changes may be made by those skilled in the art without departing from the true spirit and scope of the invention.

What we claim and desire to secure by Letters Patent of the United States is:

1. Apparatus rotatably mounting a shaft having a flange positioned thereon to a cabinet, said apparatus comprising;

(a) a deflectable key member extending from the inner surface of the cabinet and deflectable in a direction generally parallel thereto, (b) the shaft being received by an aperture in the cabinet with one surface of the flange abutting the inner surface of the cabinet and with said key member engaging the opposite surface of said flange to prevent axial motion of the shaft while permitting rotation thereof.

2. The apparatus defined in claim 1 wherein said key member is carried by a generally U-shaped member extending inwardly from the cabinet.

3. The apparatus defined in claim 2 wherein said generally U-shaped member comprises first and second spaced leg portions and a deflectable transverse portion extending therebetween, said key being positioned on said transverse portion intermediate said first and second leg portions.

4. The apparatus defined in claim 3 wherein said U-shaped member is formed integrally with the cabinet.

References Cited

UNITED STATES PATENTS

| | | | |
|---|---|---|---|
| 1,848,569 | 3/1932 | Leggett | 308—135 |
| 2,521,391 | 9/1950 | Meents | 287—20.5 X |
| 2,533,763 | 12/1950 | Cacciotti | 287—20.5 X |
| 2,640,672 | 6/1953 | Bedford | 85—5 X |
| 2,717,792 | 9/1955 | Pelley | 308—238 X |
| 2,793,886 | 5/1957 | Weiss | 287—20.5 |
| 2,824,464 | 2/1958 | Remington | 85—8.8 X |
| 2,884,283 | 4/1959 | Korol et al. | 308—15 |
| 2,894,302 | 7/1959 | Fox | 287—20.5 X |
| 3,141,251 | 7/1964 | Olson et al. | 287—20.5 X |
| 3,236,548 | 2/1966 | Manecke | 287—20 |

MARTIN P. SCHWADRON, *Primary Examiner.*

F. SUSKO, *Assistant Examiner.*

U.S. Cl. X.R.

308—135, 238